United States Patent [19]

Kaufman

[11] Patent Number: 4,574,162

[45] Date of Patent: Mar. 4, 1986

[54] COMPACT CIRCUIT PACKAGE WITH IMPROVED CONSTRUCTION FOR CLAMPING TO ENHANCE HEAT TRANSFER

[76] Inventor: Lance R. Kaufman, 131 W. White Oak Way 96N, Mequon, Wis. 53092

[21] Appl. No.: 577,205

[22] Filed: Feb. 6, 1984

Related U.S. Application Data

[62] Division of Ser. No. 362,498, Mar. 26, 1982, Pat. No. 4,449,292.

[51] Int. Cl.[4] ............................................. H01L 23/40
[52] U.S. Cl. ................................ 174/16 HS; 357/81; 361/388
[58] Field of Search ...................... 174/16 HS, 52 FP; 357/81; 361/386, 388, 389

[56] References Cited

U.S. PATENT DOCUMENTS

| | | | |
|---|---|---|---|
| 4,218,724 | 8/1980 | Kaufman | 361/399 X |
| 4,272,644 | 6/1981 | Visser et al. | 174/52 FP |
| 4,361,720 | 11/1982 | Resneau et al. | 174/16 HS |

Primary Examiner—A. T. Grimley
Assistant Examiner—D. A. Tone

[57] ABSTRACT

The compact circuit package (11) includes an insulating housing (12) providing a circuit retaining cavity (19) substantially surrounded by a pair of spaced side walls (15, 16) each terminating at a first rim (21, 22) and a second pair of spaced side walls (17, 18) each terminating at a second rim (24, 25). Each of the side walls provides an abutment (28, 31, 34) which limits the depth of entry of a electrically insulating, heat conducting substrate (30) into the cavity (19). Outer portions (44, 45) of a first pair of side walls rims (21, 22) are removed such as by a sander (46) to form a clamping surface (48) which includes an outer surface (42) of substrate (30) and reduced end portions (49, 50) of the pair of the side wall rims (21, 22) to permit increased substantial clamping pressures to a substantially planar external heat dissipating object (51) without damaging the substrate (30) and the side walls (15, 16, 17 18).

1 Claim, 9 Drawing Figures

COMPACT CIRCUIT PACKAGE WITH IMPROVED CONSTRUCTION FOR CLAMPING TO ENHANCE HEAT TRANSFER

This is a division of application Ser. No. 06/362,498 filed Mar. 26, 1982 U.S. Pat. No. 4,449,292.

BACKGROUND OF THE INVENTION

This invention relates to a compact circuit package having an improved construction for clamping to an external object to enhance heat transfer from the compact circuit package.

Heat conducting, electrically insulating substrates have been advantageously employed to retain heat generating electrical components along a first substrate side while a second oppositely disposed substrate side may be mounted to a heat sink to permit the heat generated by the electrical component to pass through the electrically insulating substrate to be dissipated at the external heat sink. One desirable construction is shown in the U.S. Pat. No. 3,958,075 entitled "High Power Thick Film Circuit With Overlapping Lead Frame", which issued on May 18, 1976 to Lance R. Kaufman.

A wide variety of circuit constructions may be located at or near the insulating substrate to be within a cavity provided by the surrounding insulating housing. By way of example, an electrical power converting thyristor firing circuit could be used, such as disclosed in U.S. Pat. No. 4,257,091 entitled "Electrical Power Converter Thyristor Firing Circuit Having Noise Immunity", which issued on Mar. 17, 1981 to Lance R. Kaufman. Optically couplable circuit elements could be used, such as shown in the U.S. Pat. No. 4,156,148 entitled "Photocoupling Structure For a Solid State Power Control Device", which issued on May 22, 1979 to Lance R. Kaufman or as shown in U.S. Pat. No. 4,266,140 entitled "Positioning Means For Optically Couplable Circuit Elements", which issued on May 5, 1981 to Lance R. Kaufman. One or more terminals could be used for the main input and/or output power connections such as disclosed in U.S. Pat. No. 4,215,235 entitled "Lead Frame Terminal", which issued on July 29, 1980 to Lance R. Kaufman. One or more variable resistance devices could be used such as disclosed in U.S. Pat. No. 4,250,481 entitled "Variable Resistance Device For Thick Film Circuitry", which issued on May 10, 1981 to Lance R. Kaufman. One or more dual resistor elements could be used such as disclosed in U.S. Pat. No. 4,196,411 entitled "Dual Resistor Element", which issued on Apr. 1, 1980 to Lance R. Kaufman. Many additional circuits could also be employed.

Heat conducting, electrically insulating substrates containing one or more heat generating electrical components have been advantageously connected to an insulating housing including a cavity surrounded by one or more edges or abutments which engage the substrate to limit the depth of entry of the substrate into the cavity. Such insulating housing provides an outer rim surrounding the cavity which is generally located in a plane spaced from another plane substantially containing the substrate second side. In such manner, clamping pressure may be applied to the insulating housing to clamp the substrate second side against an external heat dissipating object such as a heat sink to permit heat to pass from the substrate to the external heat sink without encountering any intervening thermal barriers such as solder, metalization, epoxy or the like. One highly desirable device employing peripheral clamping of the substrate by an insulating housing is shown in U.S. application Ser. No. 834,601 entitled "Power Switching Device Having Improved Heat Dissipation Means", which was filed on Sept. 19, 1977 by Lance R. Kaufman. Another highly desirable device employing peripheral clamping of the substrate by an insulating housing is shown in U.S. Pat. No. 4,218,724 entitled "Compact Circuit Package Having Improved Circuit Connectors", which issued on Aug. 19, 1980 to Lance R. Kaufman.

To provide a high degree of heat transfer, it is desirable to maintain an intimate engagement between substantial portions of the substrate second side and a corresponding area of surfaces of the heat sink. In some instances, electrically insulating and heat conducting substrates, such as ceramic for example, are punched or stamped from larger uncured sheets and thereafter fired or cured at extremely high temperatures, i.e. approximately 5000° F., which may cause deviations or warping along the substrate second side. For example, warping may cause a surface to deviate between spaced planes by one-one hundredth of an inch per each linear inch. Where such warping becomes excessive, it is difficult to clamp the substrate to the heat sink to provide the desired substantial intimate engagement between the facing surfaces without subjecting the substrate second side to additional expensive and time consuming processing such as grinding and lapping for example.

SUMMARY OF THE INVENTION

A compact circuit package and a method of construction thereof provides an improved construction for clamping to an external object to enhance heat transfer from heat generating components located within the compact circuit package.

An insulating housing is formed with a circuit retaining cavity substantially surrounded by a peripheral side wall including a wall portion terminating at a rim located substantially within a first plane. The housing is provided with structure to limit the depth of entry into the cavity. A heat conducting electrically insulating substrate is placed into engagement with the depth limiting structure to substantially enclose the cavity. A first side of the substrate facing the cavity contains a heat generating electrical component while a second oppositely disposed side of the substrate is substantially located within a second plane spaced from the first plane so that the rim extends outwardly from the substrate second side. An outer portion of the rim is removed substantially along the second plane to provide a reduced rim to be located substantially within the second plane. In such manner, the reduced rim and the second substrate side form a clamping surface located substantially within the second plane and designed to be clamped to an external heat dissipating object to permit increased substantial clamping pressure without damaging the substrate and the housing side wall.

The depth limiting structure may include a series of abutments located along the peripheral side wall and located adjacent to the rim. In such manner, the series of abutments may function to distribute clamping pressure over a greater extent of the substrate for uniform clamping of the substrate to an external heat dissipating object.

The peripheral side wall may include a first pair of spaced side walls each terminating at a first rim located substantially within the first plane and a second pair of spaced side walls each terminating at a second rim located substantially within a third plane spaced from the first plane with the first and second rims surrounding an opening into the cavity. The placement of the insulating substrate into the opening to engage the depth limiting structure substantially encloses the cavity. With the substrate engaging the depth limiting stucture, an outer substrate surface is located within the second plane which, in turn, is spaced between the first plane containing the first rims and the third plane containing the second rims. In such stage of construction, any convenient tool, such as a rotary sander for example, may be utilized to remove an outer portion of the second rims substantially along the second plane to remove the outer rim portions to provide reduced rims. In such manner, the clamping surface is formed wherein the second reduced rims and the substrate second side are substantially within a common plane which is specially designed to be clamped to a substantially planar external heat dissipating object to permit increased substantial clamping pressures which may be apportioned between the housing and the substrate without damaging the substrate and housing side walls.

The improved construction of the compact circuit package permits the use of substrates containing substantial deviations by removing the necessary amount of rim portion to align with the adjacent substrate second surface. In such manner, increased substantial clamping pressures provide an enhanced bond between the substrate second side and an external heat dissipating object without the use of intervening thermal junctions such as solder, metalization, epoxy or the like. The improved construction permits increased heat transfer from heat generating electrical components located at or adjacent the substrate first side located within the housing cavity to an external location. The method and structure permits the use of substantial clamping pressures without subjecting the heat generating circuitry to compressive forces to permit such circuit elements to expand and contract due to temperature variations for improved efficiency.

DETAILED DESCRIPTION OF THE PREFERRED EMBODIMENT

Figure 1:
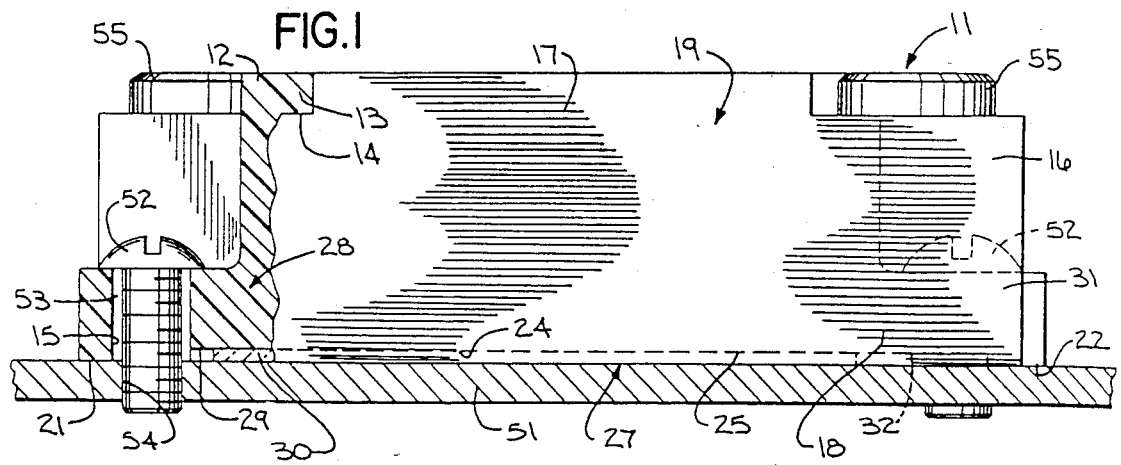
FIG. 1 is a side elevational view with parts broken away illustrating a compact circuit package containing an improved construction for clamping to an external heat sink by the use of clamping bolts.

A compact circuit package 11 includes a housing 12 formed of an electrically insulating material. A base plate 13 of housing 12 includes an inner wall surface 14 surrounded by a pair of oppositely spaced side walls 15 and 16 joined by a pair of oppositely spaced side walls 17 and 18. The side walls 15, 16, 17 and 18 are joined in a rectangular configuration to provide a peripheral side wall 20 surrounding the base surface 14 and defining an inner cavity 19.

The side wall 15 provides an outer rim 21 while the oppositely spaced side wall 16 provides a similar outer rim 22, both of which are located substantially within a plane 23. The side wall 17 terminates at a rim 24 while the oppositely spaced side wall 18 terminates in a rim 25, both of which are located substantially within a plane 26 spaced from plane 23.

The series of rims 21, 22, 24 and 25 form a rectangular configuration and surround an opening 27 to the inner cavity 19.

The side wall 15 provides an abutment 28 having an outer surface 29 forming a ledge to be utilized to limit the depth of entry of a heat conducting, electrically insulating substrate 30. The side wall 16 contains a similar abutment 31 providing an outer surface 32 forming a ledge to be engaged with the substrate 30. The side wall 17 includes a series of spaced abutments 33 each including an associated surface 34 for providing ledges to be engaged by the substrate 30. The side wall 18 similarly includes a series of spaced abutments 33' providing corresponding surface ledges 34' in a manner similar to wall 17.

During assembly, one or more heat generating electrical components are affixed to a first side 35 of substrate 30. For example, one or more of lead frames 36 may be bonded to surface 35 such as through metalization, solder, epoxy or similar material. Thereafter, one or more heat generating components, such as a thyristor or other semiconductive devices 37 may be attached to an upper portion of lead frame 36 through an intervening layer 38 of solder, metalization, epoxy or the like. Also, one or more terminal connectors 55 may be bonded to the substrate 30 and/or lead frames 36 such as illustrated in U.S. Pat. No. 4,215,235. Further, one or more electrical leads 56 may be attached to the substrate 30 and/or lead frames 36 through appropriate solder 57. The inter-connection of a series of circuit assemblies 39 such as lead frames 36, thyristors 37 and/or other circuit devices to the surface 35 of substrate 30 provides a self contained sub-assembly 40.

The sub-assembly 40 including the substrate 30 and attached circuit assemblies 39 is inserted into opening 27 until further movement is limited by the series of abutments 29, 32, 34 and 34'. When outer peripheral edges 41 of substrate 30 engage the series of abutments 29, 32, 34 and 34', the cavity 19 is substantially enclosed so that the circuit assemblies 39 are substantially surrounded by the housing 12 and substrate 30.

Figure 2:
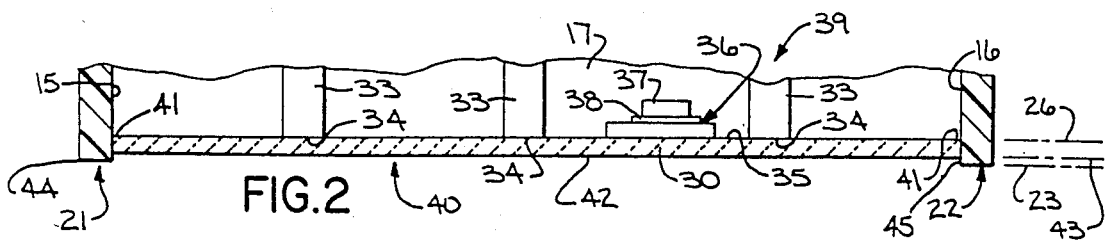
FIG. 2 is a diagrammatic illustration showing a sub-assembly for the compact circuit package of FIG. 1 and including a heat generating insulating substrate engaging a series of abutments provided by a housing prior to removal of the outer rim portions.

When the abutments 29, 32, 34 and 34' engage the peripheral edge 41 of substrate 30, an oppositely disposed outer surface 42 of substrate 30 is substantially located within a plane 43 which is spaced between plane 23 and plane 26. In such condition, as illustrated in FIG. 2, outer end portions 44 and 45 of rims 21 and 22, respectively, extend outwardly from surface 42 of substrate 30.

Figure 3:
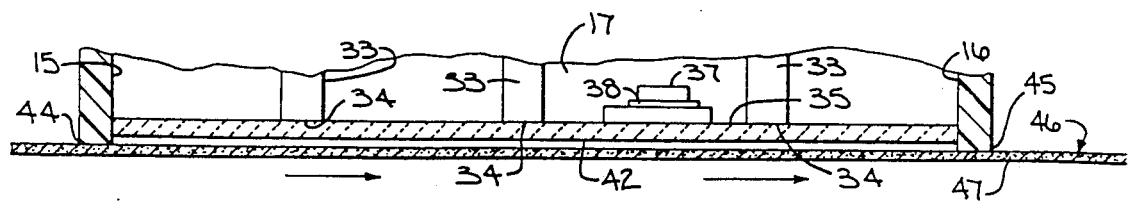
FIG. 3 is another view of the sub-assembly of FIG. 2 and illustrating the removal of the outer rim portions by the use of a belt sander.
Figure 4:
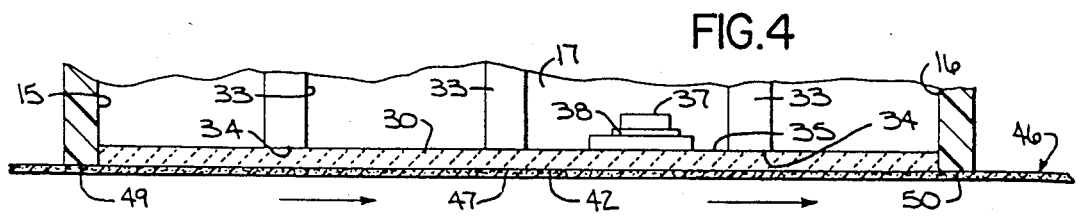
FIG. 4 is another view of the sub-assembly of FIGS. 2 and 3 illustrating the removal of the outer rim portions by the belt sander illustrated in FIG. 3.
Figure 5:
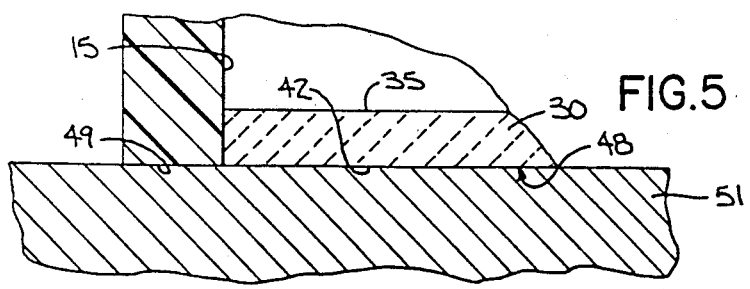
FIG. 5 is a partial diagrammatic illustration of the sub-assembly of FIG. 4 attached to an external heat sink.
Figure 6:
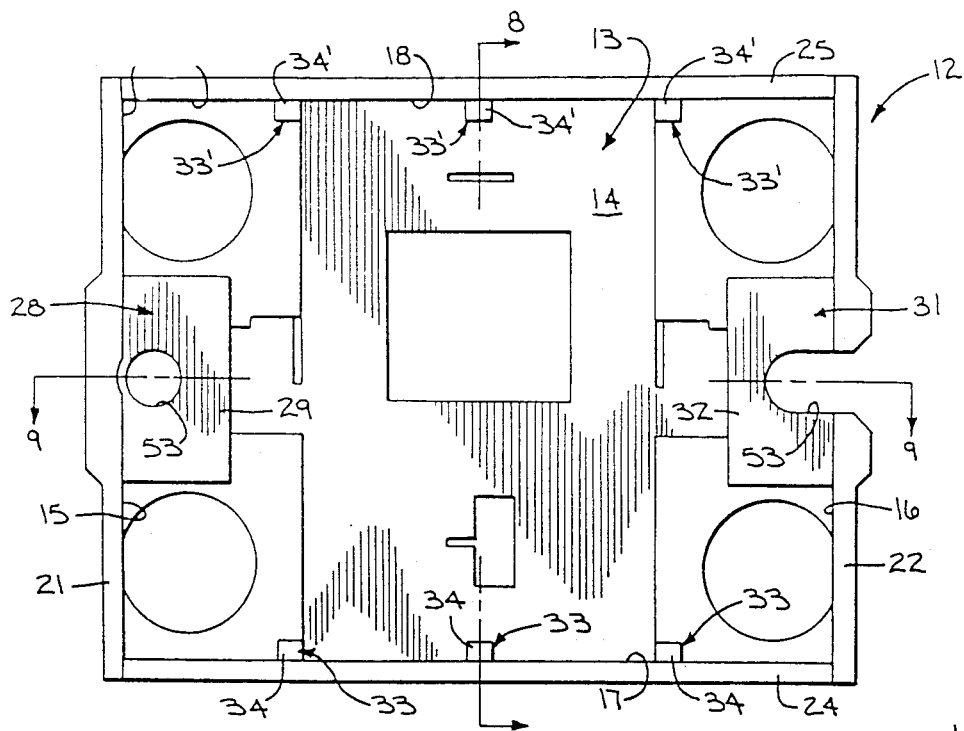
FIG. 6 is a bottom view of the housing prior to removal of the outer rims for the compact circuit package of FIG. 1.
Figure 7:
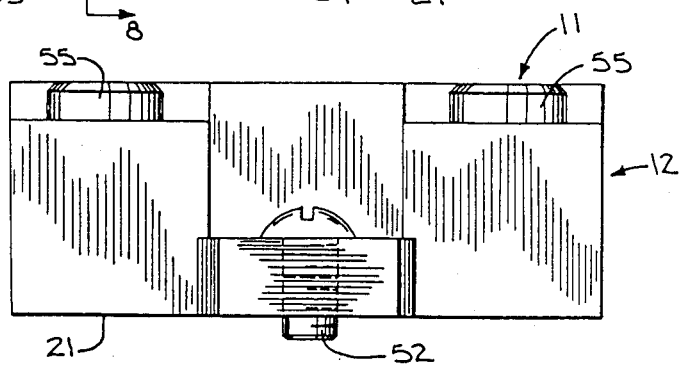
FIG. 7 is an end view of the compact circuit package of FIG. 1 with the outer rim portions removed but without the heat sink.
Figure 8:
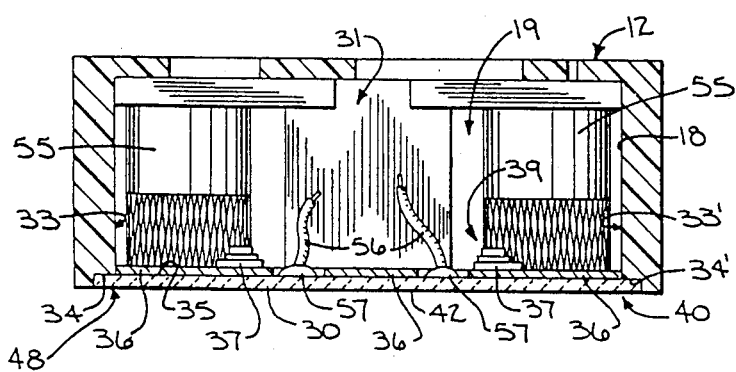
FIG. 8 is a sectional view along the longitudinal axis of the compact circuit package of FIG. 7.
Figure 9:
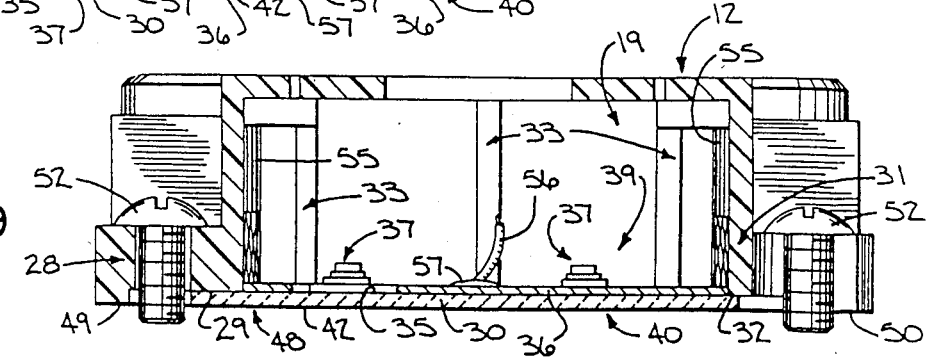
FIG. 9. is a sectional view along the transverse axis of the compact circuit package of FIG. 7.

A belt sander 46 includes a continuous abrasive web 47 which is applied to the outer portions 44 and 45 of rims 21 and 22, respectively, as illustrated in FIG. 3. The belt sander 46 continuously operates until the outer portions 44 and 45 are removed so that the ends of rims 21 and 22, respectively, are located within plane 43 to be substantially co-extensive with surface 42 of substrate 30. A clamping surface 48 is thereby provided which includes surface 42 of substrate 30 and reduced surfaces 49 and 50 of rims 21 and 22, respectively, all of which are located substantially within the common plane 43.

If desired, the cavity 19 may be filled with a potting compound which further acts to secure substrate 32 to housing 12. The formation of the clamping surface 48 provides an improved construction for the compact circuit package which may be advantageously clamped to an external heat dissipating object, such as a heat sink 51. For example, clamping may be provided by threaded bolts 52 which are secured within openings 53 of housing 12 and secured to appropriate threaded openings 54 provided by heat sink 51. Tightening of the clamping bolts 52 draws the heat sink 51 into tight engagement with surface 42 of ceramic 30 and with the reduced outer portions 49 and 50 of rims 21 and 22, respectively.

The placement of the reduced portions 49 and 50 of rims 21 and 22, respectively, within the same plane as surface 42 of substrate 30 provides the clamping surface 48. In such manner, substrates containing substantial deviations may be advantageously utilized by removing the necessary amount of rim portion to be aligned with the adjacent substrate 42. Such construction permits clamping pressure to be distributed along the substrate 42 and outer portions 49 and 50 of rims 21 and 22 thereby permitting increased substantial clamping pressure without damaging the substrate 30 and the side walls 15 and 16. Such increased clamping pressure permits the efficient transfer of larger amounts of heat from the circuits 39 through substrate 30 to be dissipated by the heat sink 51. By providing increased clamping pressure along the clamping surface 48, increased substantial amounts of heat may be passed across the junction between surface 42 of substrate 30 and heat sink 51.

A compact circuit package with an improved construction and method thereof for clamping to enhance heat transfer has been provided to improve efficiency of circuit operation which may be produced in a relatively economical method of manufacture. The enhancement of the heat transfer across the interface between the substrate 30 and the external heat dissipating object 51 permits the operation of circuits 39 at lower temperatures thereby enabling higher current transfers within such circuits 39. Furthermore, the improved clamping construction permits the use of substantial clamping pressures which do not engage the circuits 39 which might otherwise damage such circuits 39 or detract from their efficient operation.

Various modes of carrying out the invention are contemplated as being within the scope of the following claims which particularly point out and distinctly claim the subject matter which is regarded as the invention.

I claim:

1. A compact circuit package with improved construction for clamping to enhance heat transfer, comprising
  an insulating housing providing a circuit retaining cavity including a base surface surrounded by a peripheral side wall having
    a first pair of spaced side wall portions each terminating at a first rim located substantially within a first plane and
    a second pair of spaced side wall portions each terminating at a second rim located substantially within a second plane spaced from said first plane
    with said first and second rims surrounding an opening into said cavity and each of said first and second side wall portions containing an abutment to limit the depth of entry into said cavity,
  a heat conducting electrically insulating substrate located within said opening and engaging said abutments to substantially enclose said cavity and including
    a first side facing said cavity and containing a heating generating electrical component and
    an oppositely disposed second side located substantially within a third plane substantially co-extensive with at least one of said first and second planes
  to form a clamping surface including said substrate second side and at least one pair of said first and second rims to permit said clamping surface to be clamped against an external heat dissipating object by clamping pressure being distributed along said substrate second side and at least one pair of said first and second rims to permit increased substantial clamping pressure without damaging said substrate and said side walls.

* * * * *